United States Patent
Yeh et al.

(10) Patent No.: US 6,914,819 B2
(45) Date of Patent: Jul. 5, 2005

(54) NON-VOLATILE FLASH MEMORY

(75) Inventors: Chih-Chieh Yeh, Hsinchu (TW);
Hung-Yueh Chen, Hsinchu (TW);
Wen-Jer Tsai, Hsinchu (TW);
Tao-Cheng Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/653,892

(22) Filed: Sep. 4, 2003

(65) Prior Publication Data

US 2005/0052228 A1 Mar. 10, 2005

(51) Int. Cl.[7] .............................................. G11C 11/34
(52) U.S. Cl. ............................ 365/185.18; 365/185.16
(58) Field of Search ......................... 365/185.18, 185.16

(56) References Cited

U.S. PATENT DOCUMENTS 5,768,192 A    6/1998  Eitan .................... 365/185.24
6,687,154 B2 *  2/2004  Lee et al. ............... 365/185.03

OTHER PUBLICATIONS

C.C. Yeh et al., "PHINES: A Novel Low Power Program/Erase, Small Pitch, 2–Bit per Cell Flash Memory", IEDM, 2000, pp. 931–934.

Amy Hsiu–Fen Chou et al., "Comprehensive Study on a Novel Bidirectional Tunneling Program/Erase NOR–Type (BiNOR) 3–D Flash Memory Cell", IEEE Transactions on Electron Devices, vol. 48, No. 7, Jul. 2001, pp. 1386–1393.

\* cited by examiner

Primary Examiner—Michael Tran
(74) Attorney, Agent, or Firm—Akin Gump Strauss Hauer & Feld, LLP

(57) ABSTRACT

A method of operating a non-volatile memory cell, wherein the non-volatile memory cell includes a word line, a first bit line, and a second bit line, the method includes programming the memory cell that includes applying a high positive bias to the first bit line, applying a ground bias to the second bit line, and applying a high negative bias to the word line, wherein positively-charged holes tunnel through the dielectric layer into the trapping layer.

20 Claims, 4 Drawing Sheets

NON-VOLATILE FLASH MEMORY

FIELD OF THE INVENTION

This invention is in general related to a flash memory, and more particularly, to a novel flash memory cell, and the data patterns and sensing scheme thereof.

BACKGROUND OF THE INVENTION

Memory devices for non-volatile storage of information have been widely in use. Examples of such memory devices include read only memory (ROM), programmable ROM (PROM), erasable programmable ROM (EPROM), electrically erasable programmable ROM (EEPROM), and flash EEPROM.

A flash memory generally refers to a flash EEPROM, which may be erased in blocks of data instead of one byte at a time. Many modern PCs have their BIOS stored on a flash memory chip so that the BIOS can easily be updated if necessary. Such a BIOS is sometimes called a flash BIOS. Flash memory is also popular in devices such as modems because a flash memory allows these devices to be updated to support, for example, new protocols as they become standardized.

A flash memory device generally includes an array of memory cells arranged in rows and columns. Each memory cell includes a MOS transistor structure having a gate, a drain, a source, and a channel defined between the drain and the source. The gate corresponds to a word line and the drain and the source correspond to bit lines of the memory array. The gate of a conventional memory cell is generally a dual-gate structure, including a control gate and a floating gate, wherein the floating gate is sandwiched between two dielectric layers to trap carriers such as electrons, thereby "program" the cell. In other words, in a conventional cell, a first dielectric layer is formed over the channel, the floating gate is formed over the first dielectric layer, a second dielectric layer is formed over the floating gate, and the control gate is finally formed over the second dielectric layer.

During programming, a set of programming biases are applied to selected word lines and bit lines. One or more memory cells corresponding to the selected word lines and bit lines are biased in the programming state. For a single memory cell, different biases applied to the source and drain thereof creates an electric field along the channel thereof, through which electrons gain enough energy. Such hot electrons then tunnel through the first dielectric layer into the floating gate and become stored therein. As a result of the stored electrons in the floating gate, the threshold voltage of the memory cell is modified. The changing of the threshold voltage determines whether the memory cell is programmed.

To read a memory cell, reading biases are applied and a sensing device reads a current passing through the memory cell. If a memory cell is programmed, or has electrons stored in its floating gate, its current level is different from those memory cells which are not programmed. Therefore, based on the measured current level, the sensing device is capable of determining the state of each memory cell.

To erase the information stored in a flash memory, erasing biases are applied thereto to force the stored electrons to tunnel out of the floating gate, through a well-known mechanism in Fowler-Nordheim (F-N) tunneling.

However, certain problems are associated with a conventional flash memory, such as high power consumption, program and read disturbances. High power consumption is due to high program and erasure voltages required to induce electron tunneling for program and erase operations. Program and read disturbances relate to current leakage occurring to the non-selected neighboring memory cells while programming or reading a certain memory cell.

A disturbance in a flash memory array generally refers to a phenomenon when one selected cell in the memory array is being read or programmed, another programmed memory cell sharing the same word line or bit line may experience current leakage caused by electron tunneling of the selected cell, and a loss of electrons stored in the floating gate may result in a change of status from "programmed" to "erased". The read disturbance may be explained with reference to FIG. 1, which shows a flash memory array comprising conventional floating gate memory cells.

Referring to FIG. 1, a flash memory array 100 includes a plurality of word lines WL1, WL2 ... WL6, and a plurality of bit lines BL1, BL2, ..., BL5. Each intersection of the word lines and bit lines define a memory cell. Each of the memory cells also includes a floating gate (not shown). As indicated, a memory cell A corresponding to word line WL3 and bit lines BL2 and BL3 is selected by biasing the corresponding word line and bit lines. For example, word line WL3 is biased at 3V, bit line BL2 is biased at 0.3V, and bit line BL3 is biased at 1.5V. Word lines WL1, WL2, WL4, WL5, and WL6 are grounded (0V), and bit lines BL1, BL4, and BL5 are unbiased, or floating (F). Under such biasing conditions, the information stored in cell A may be read. Meanwhile, the memory cells sharing the same word line or bit line with cell A are also under certain biases. For example, cell B shares the same word line WL3 and bit line BL2 with cell A. Therefore, assuming bit line BL2 corresponds to the drain of cell B, an electric field exists between the gate and the drain of cell B, which induces a leakage current through cell B. The leakage current through cell B depends on the threshold voltage thereof, which depends upon the electron density in the floating gate thereof. A lower threshold voltage will result in a higher leakage current. Similarly, cells C and D may experience current leakages due to the biases at bit line BL2 and bit line BL3, respectively. The leakage currents through the neighboring cells, e.g., cells B, C, and D, will flow through bit lines BL2 and BL3, and may generate sensing errors of cell A.

SUMMARY OF THE INVENTION

It is therefore an object of the present invention to provide a novel flash memory, a novel programming method and sensing scheme thereof, with a low power consumption, reduced leakage problems, and simple process.

In accordance with the present invention, there is provided a method of operating a non-volatile memory cell, wherein the non-volatile memory cell includes a word line, a first bit line, and a second bit line, the method includes programming the memory cell that includes applying a high positive bias to the first bit line, applying a ground bias to the second bit line, and applying a high negative bias to the word line, wherein the memory cell includes a control gate, a source region, a drain region, a channel region defined between the source and drain regions, a trapping layer provided above the channel region, and a dielectric layer provided between the trapping layer and the channel region, wherein the control gate corresponds to the word line, one of the source and drain corresponds to the first bit line, and the other one of the source and drain corresponds to the second bit line, and wherein positively-charged holes tunnel through the dielectric layer into the trapping layer.

Also in accordance with the present invention, there is provided an operation method of a flash memory cell, wherein the flash memory cell includes a first bit line, a second bit line, and a word line, the method includes erasing the memory cell that includes applying a first bias to the first bit line, applying a second bias to the second bit line, applying a third bias to the word line, wherein the memory cell includes a source, a drain, a channel region defined between the source and the drain, a first dielectric layer formed over the channel region, a trapping layer formed over the first dielectric layer, a second dielectric layer formed over the trapping layer, and a control gate formed over the second dielectric layer, wherein the control gate corresponds to the word line, one of the source and drain corresponds to the first bit line, and the other one of the source and drain corresponds to the second bit line, and wherein the first, second, and third biases are chosen so that electrons tunnel through one of the first and second dielectric layers into the trapping layer.

Still in accordance with the present invention, there is provided an operation method of a memory device, including providing a memory array including a plurality of memory cells, wherein the memory cells are defined by a plurality of rows and a plurality of columns, providing a plurality of word lines, each corresponding to one of the rows, wherein each memory cell corresponds to a word line, providing a plurality of bit lines, each corresponding to one of the columns, wherein each memory cell corresponds to a first bit line and a second bit line, and programming at least one of the memory cells. Programming the at least one of the memory cells further includes applying a first bias onto the first bit line of the memory cell, applying a second bias onto the second bit line of the memory cell, and applying a third bias onto the word line of the memory cell, wherein the voltage level of the third bias is lower than the voltage levels of the first and second biases.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Reference will now be made in detail to the preferred embodiments of the invention, examples of which are illustrated in the accompanying drawings. Wherever possible, the same reference numbers will be used throughout the drawings to refer to the same or like parts.

According to the present invention, there is provided a novel flash memory device in a "programming by hot hole injection nitride electron storage" (PHINES) cell and method thereof, wherein the memory device may comprise a memory array including a matrix of memory cells.

Figure 1:
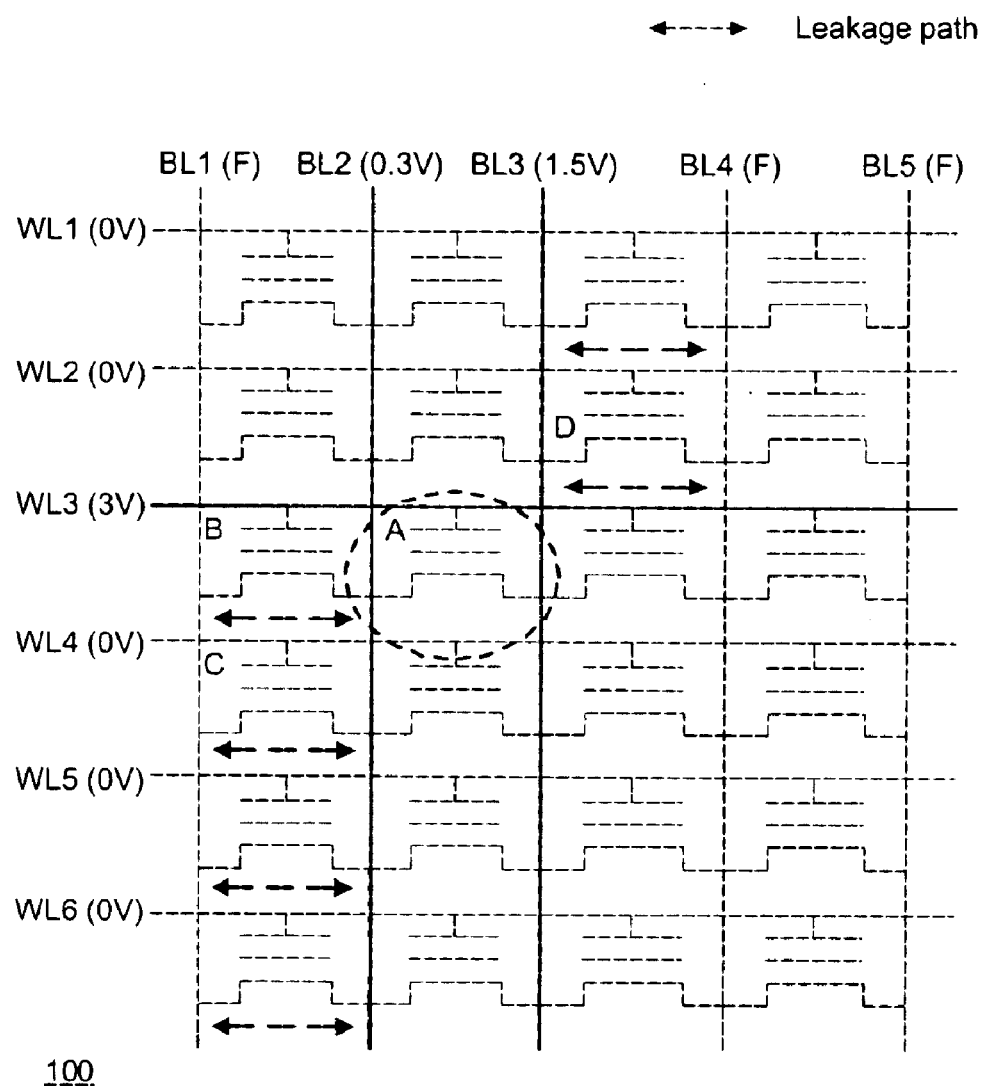
FIG. 1 is a circuit diagram of a conventional flash memory array and illustrates a leakage problem associated with a conventional flash memory array.
Figure 2:
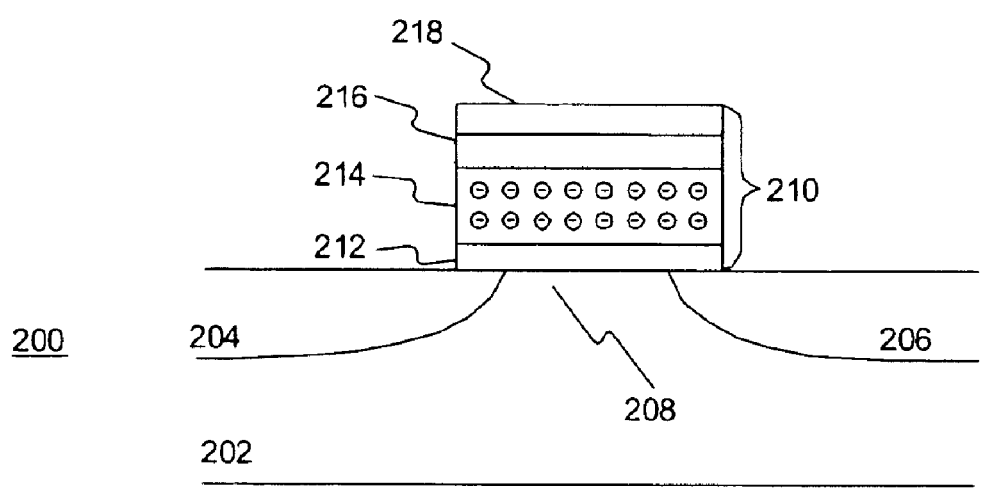
FIG. 2 shows a memory cell consistent with the present invention.

FIG. 2 shows the cell structure of an exemplary PHINES memory cell 200 consistent with the present invention. Referring to FIG. 2, there is provided a semiconductor substrate 202 with two diffused regions, a source 204 and a drain 206, formed therein. Semiconductor substrate 202 may comprise any conventional semiconductor material, such as silicon. A channel region 208 is defined as the region of semiconductor substrate 202 between source 204 and drain 206. A multi-layer gate structure 210 is formed over the channel region, including a first insulating layer 212, a trapping layer 214, a second insulating layer 216, and a control gate 218. First insulating layer 212 may be comprised of silicon oxide, trapping layer 214 may be comprised of silicon nitride, second insulating layer 216 may be comprised of silicon oxide, and control gate 218 may be comprised polycrystalline silicon, a metal, metal silicide, or a combination thereof.

In one aspect, control gate 218 corresponds to a word line of the memory array, and source 204 and drain 206 correspond to bit lines of memory array. Therefore, each memory cell has a corresponding word line and a pair of corresponding bit lines, or a first bit line and a second bit line.

FIG. 2 shows a distribution profile of electrons in trapping layer 214 before memory cell 200 is programmed. It is to be understood that the electron profile shown in FIG. 2 is not drawn to scale. It is also to be understood that a MOS structure is generally symmetrical and the source and drain are interchangeable. Therefore, in the above and following descriptions, the source and drain of memory cell 200, or the first and second bit lines, may be interchanged without affecting the functions thereof or the scope of the present invention.

The operations of memory cell 200 are next explained with reference to FIG. 2. During programming, a set of programming biases are applied to the word line and bit lines. Specifically, the word line, or control gate 218, is biased at a high negative voltage, e.g., −5V, the first bit line of memory cell 200, or source 204, is grounded, and the second bit line of memory cell 200, or drain 206, is biased at a high positive voltage, e.g., +5V. Under such biasing conditions, a horizontal electric field is created along channel 208 and a vertical electric field is created across structure 210. The horizontal electric field draws positively-charged holes out of drain 206 toward source 204. The holes are accelerated by the horizontal electric field, attaining a higher energy. When the holes have attained enough energy to break the barrier potential of first dielectric layer 212, and with the inducement of the vertical electric field, some holes will be "injected" or tunnel through first dielectric layer 212 and into trapping layer 214, and are trapped therein. Specifically, the holes are injected into the right side of trapping layer 214. The left side of trapping layer 214 is generally absent of holes. Therefore, the charge distribution in trapping layer 214 is modified by the trapped holes.

It is to be understood that a different set of bias voltages may be applied to the word line and first and second bit lines to program the memory cell, as long as the biasing conditions provide the requisite electric fields to allow holes to gain sufficient energy to tunnel through first dielectric layer 212 into trapping layer 214.

To read memory cell 200, a bias of 3V is applied to the word line, or control gate 218, while drain 206 is grounded. A bias of 1.5V is applied to source 204. As a result, a channel is generated in channel region 208. A sensing circuit (not shown) external to memory cell 200 then senses the current passing through the channel due to the bias difference between source 204 and drain 206. If memory cell 200 is programmed, trapping layer 214 includes trapped positively-charged holes. Therefore, compared to an un-programmed memory cell 200, the threshold voltage of a programmed memory cell 200 is lower because of the trapped holes, and consequently the current sensed by the sensing circuit is higher for a programmed memory cell 200 than an un-programmed memory cell 200.

If a state of "1" denotes a state having a higher sensing current and a state of "0" denotes a state having a lower sensing current, then a programmed memory cell 200 has a state of "1" and an non-programmed memory cell 200 has a state of "0".

To erase memory cell 200, the word line, or control gate 218, is biased at a high negative voltage, e.g., −8V, and both of the first bit line and the second bit line of memory cell 200, or source 204 and drain 206, are biased at high positive voltages, e.g., +10V. A strong vertical electric field is formed between control gate 218 and source 204 and drain 206, and electrons in control gate 218 are "pulled" or tunnel through second oxide layer 216 into trapping layer 214. The electrons and positively-charged holes are recombined or compensated in trapping layer 214. As a result, trapping layer 214 is restored to the pre-programming status and the threshold voltage of memory cell 200 is raised to a higher level, which corresponds to the "0" state.

Similarly, the applicable biases for reading and erasing memory cell 200 are not limited to those exemplary biases described above. Different sets of voltages may be applied so long as the desired reading and erasing results are obtained.

Accordingly, the operations of memory cell 200, as described above, are low power operations, and are suitable for mass storage applications. Also according with the present invention, a plurality of memory cells 200 may be arranged to form a memory array. In one aspect, the memory array is formed as a virtual ground array, wherein the bit lines are buried diffusion areas, and the word lines are gate contacts, such as polycrystalline silicon stripes. Memory cells in a column may share the same bit lines or buried diffusion areas, and memory cells in a row may share the same word line. Thus, the memory array is contact-less and does not require any field isolation. Therefore, the present invention may realize a very high density memory device.

Figure 3:
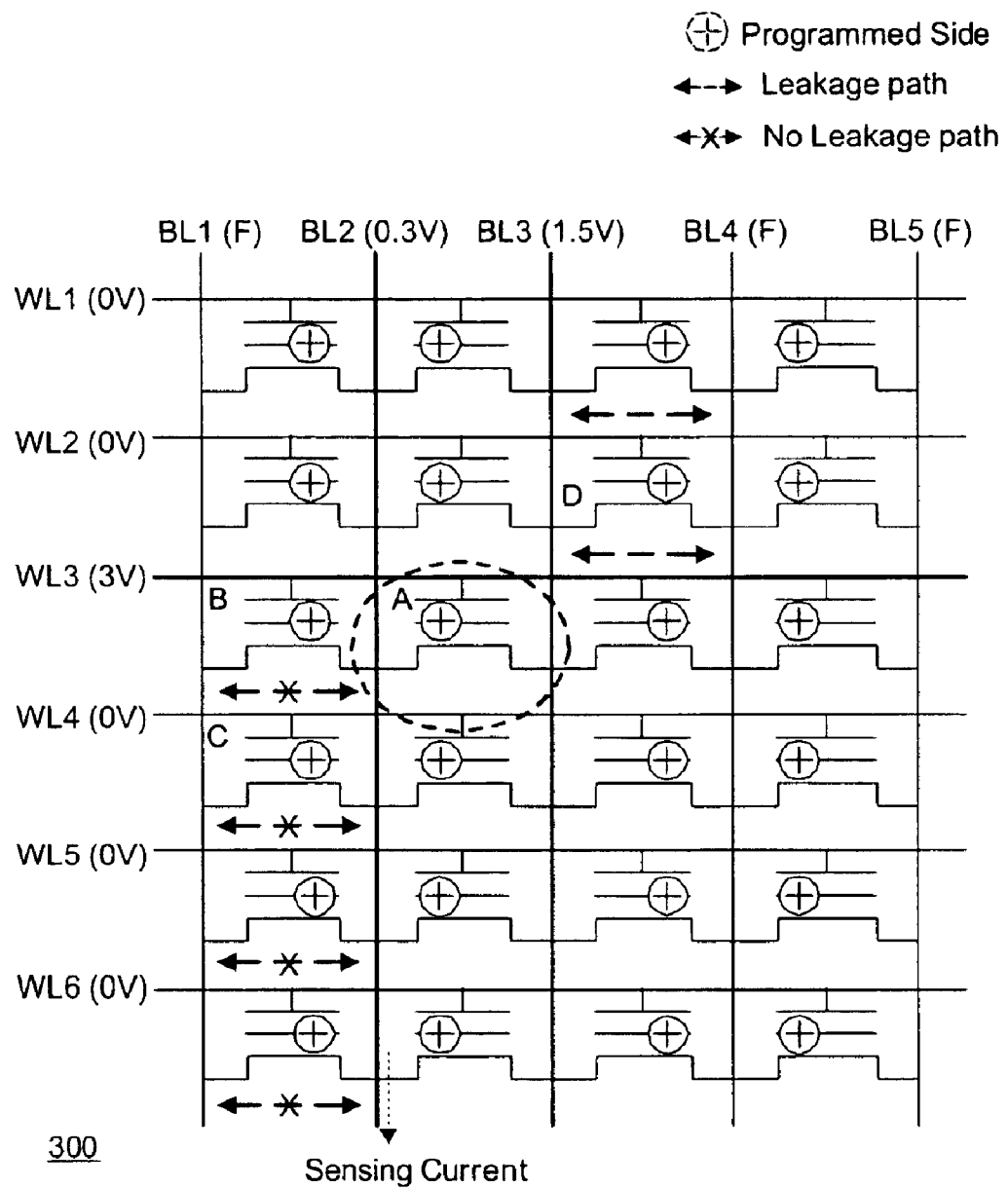
FIG. 3 shows a first data pattern for a memory array consistent with the present invention.
Figure 4:
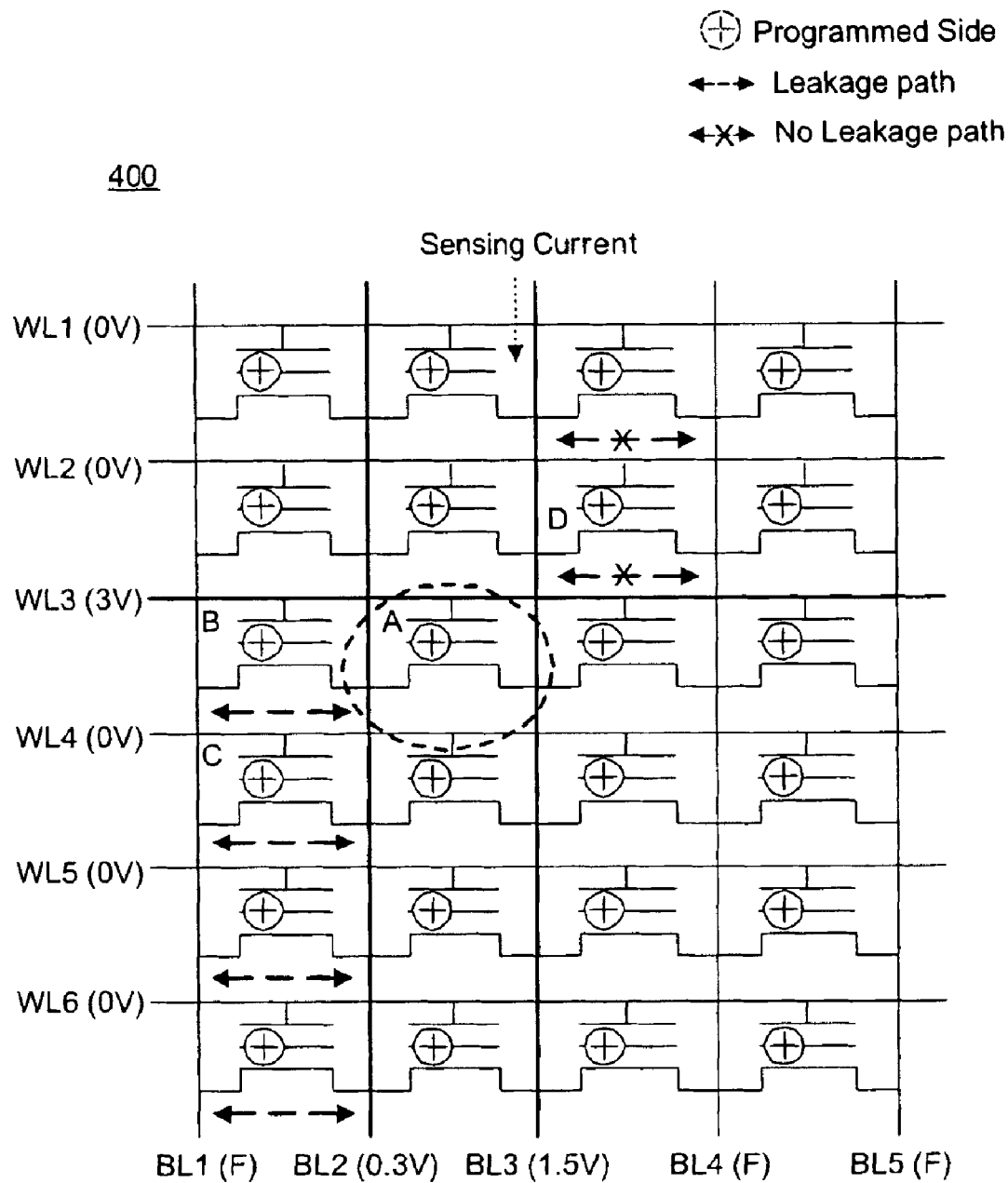
FIG. 4 shows a second data pattern for a memory array consistent with the present invention.

Also in accordance with the present invention, there are provided novel data patterns of a flash memory device that have a reduced read disturbance. FIG. 3 shows a first embodiment of a data pattern that reduces the read disturbance. FIG. 4 shows a second embodiment of a data pattern that reduces the read disturbance.

Referring to FIG. 3, a flash memory array 300 includes a plurality of word lines WL1, WL2 . . . WL6, and a plurality of bit lines BL1, BL2 . . . BL5. The intersections of word lines and bit lines define a plurality of memory cells, each of which corresponds to a word line and a pair of bit lines. FIG. 3 also indicates a data pattern wherein consecutive columns of memory cells are programmed in alternating sides of the trapping layers. Specifically, for example, a first column of memory cells located between bit lines BL1 and BL2 are programmed on the right side of the trapping layer, a second column of memory cells located between bit lines BL2 and BL3 are programmed on the left side of the trapping layer, and a third column of memory cell located between bit lines BL3 and BL4 are programmed to the right side of the trapping layer. A memory cell is defined as having been "programmed on the right side" when hot holes tunnel into the right side of the trapping layer of the memory cell and are stored therein. Similarly, a memory cell is defined as having been "programmed on the left side" when hot holes tunnel into the left side of the trapping layer of the memory cell and are stored therein.

However, it is to be understood that "left side" and "right side" are only relative terms that depend on the disposition of the memory cell, and the terms may be interchanged without affecting the functions of the memory cell.

Referring again to FIG. 3, a memory cell A corresponding to word line WL3 and bit lines BL2 and BL3 is selected by biasing the corresponding word line and bit lines. Specifically, word line WL3 is biased at 3V, bit line BL2 is biased at 0.3V, and bit line BL3 is biased at 1.5V. Word lines WL1, WL2, WL4, WL5, and WL6 are grounded, and bit lines BL1, BL4, and BL5 are unbiased, or floating. Under such biasing conditions, the information stored in cell A may be read.

The trapping layer of cell B is programmed on the right side. Therefore, the electron distribution in the trapping layer is low on the right side but high on the left side. Because bit line BL1 corresponding to the left side of cell B is floating, the electric field in cell B is not sufficient to cause leakage current between bit lines BL1 and BL2 through cell B. Similarly, cell C does not have a high electron density in the right side of the trapping layer, and therefore also has a reduced leakage current.

Because the leakage current of the memory cells between bit lines BL1 and BL2 is reduced, memory cell A may be read by measuring or sensing the current through bit line BL2 instead of bit line BL3 to reduce sensing error. In other words, a memory cell may be read by sensing the current that flows through a bit line that is located on the same side of the "programmed" side of the memory cell. For example, in FIG. 3, cell A is programmed to the left side, and may be read by sensing the current present on bit line BL2, which is also on the left side of cell A.

A second embodiment of method and array of the present invention is shown in FIG. 4, which indicates a different data pattern, wherein all of the memory cells in a memory array 400 are programmed to the same side, e.g., the left side. For the reasons already discussed above, current leakage may be reduced for memory cells not selected for reading. Similarly, cell A may be read by sensing the current through bit line BL3 instead of bit line BL2 to reducesensing error. In other words, a memory cell may be read by sensing a current that flows through a bit line located on the opposite side from the programmed side of the memory cell. For example, in FIG. 4, cell A is programmed to the left side, and may be read by sensing the current on bit line BL3, which is on the right side of cell A.

As described above, by sensing the current through a bit line that has a reduced current leakage, the sensing methods consistent with the present invention provides a reduced read disturbance.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of operating a non-volatile memory cell, wherein the non-volatile memory cell includes a word line, a first bit line, and second bit line, the method comprising:
   programming the memory cell, including
      applying a high positive bias to the first bit line,
      applying a ground bias to the second bit line, and
      applying a high negative bias to the word line,
      wherein the memory cell includes a control gate, a source region, a drain region, a channel region defined between the source and drain regions, a trapping layer provided above the channel region, and a dielectric layer provided between the trapping layer and the channel region, wherein the control gate corresponds to the word line, one the source and drain corresponds to the first bit line, and the other one of the source and drain corresponds to the second bit line, and
      wherein positively-charged holes tunnel through the dielectric layer into the trapping layer.

2. The method of claim 1, wherein the trapping layer traps the holes tunneled from the channel region and retains the holes.

3. The method of claim 1, wherein the holes tunnel into a portion of the trapping layer next to the first bit line.

4. The method of claim 1, further comprising reading the memory cell, including
   applying a fourth bias on the first bit line;
   applying a fifth bias on the second bit line; and
   applying a sixth bias on the word line.

5. The method of claim 1, wherein the voltage level of the sixth bias is higher than both the voltage level of the fourth bias and the voltage level of the fifth bias.

6. The method of claim 1, further comprising measuring a current passing through the memory cell, thereby determining a state thereof.

7. An operation method of a flash memory cell, wherein the flash memory cell includes a first bit line, a second bit line, and a word line, the method comprising:
   erasing the memory cell, including
      applying a first bias to the first bit line, wherein the first bias is a high positive voltage,
      applying a second bias to the second bit line, wherein the second bias is a high positive voltage,
      applying a third bias to the word line, wherein the third bias is a high negative bias,
   wherein the memory cell includes a source, a drain, a channel region defined between the source and the drain, a first dielectric layer formed over the channel region, a trapping layer formed over the first dielectric layer, a second dielectric layer formed over the trapping layer, and a control gate formed over the second dielectric layer, wherein the control gate corresponds to the word line, one of the source and drain corresponds to the first bit line, and the other one of the source and drain corresponds to the second bit line, and
   wherein the first, second, and third biases are chosen so that electrons tunnel through one of the first and second dielectric layers into the trapping layer.

8. The method of claim 7, wherein the trapping layer comprises a nitride.

9. The method of claim 7, wherein the first bias and the second bias have a voltage level higher than that of the third bias.

10. The method of claim 7, further comprising programming the memory cell, including
    applying a fourth bias to the first bit line,
    applying a fifth bias to the second bit line,
    applying a sixth bias to the word line,
    wherein the voltage level of the sixth bias is lower than the voltage levels of the fourth and fifth biases.

11. The method of claim 7, further comprising reading the memory cell, including
    applying a seventh bias on the first bit line;
    applying an eighth bias on the second bit line; and
    applying a ninth bias on the word line,
    wherein the voltage level of the ninth bias is higher than both the voltage level of the seventh bias and the voltage level of the eighth bias.

12. An operation method of memory device, comprising:
    providing a memory array including a plurality of memory cells, wherein the memory cells are defined by a plurality of rows and a plurality of columns and wherein each of the memory cells includes a channel region defined between the source and drain regions, a trapping layer provided above the channel region, and a dielectric layer provided between the trapping layer and the channel region, and wherein positively-charged roles tunnel through the dielectric layer into the trapping layer;
    providing a plurality of word lines, each corresponding to one of the rows, wherein each memory cell corresponds to a word line;
    providing a plurality of bit lines, each corresponding to one of the columns, wherein each memory cell corresponds to a first bit line and a second bit line; and
    programming at least one of the memory cells, including
       applying a first bias onto the first bit line of the memory cell,
       applying a second bias onto the second bit line of the memory cell, and
       applying a third bias onto the word line of the memory cell,
    wherein the voltage level of the third bias is lower than the voltage levels of the first and second biases.

13. The method of claim 12, further comprising reading at least one of the memory cells, including
    applying a fourth bias onto the first bit line of the memory cell,
    applying a fifth bias onto the second bit line of the memory cell, and
    applying a sixth bias onto the word line of the memory cell,
    wherein the voltage level of the six bias is higher than the voltage levels of the fourth and fifth biases.

14. The method of claim 12, wherein the memory array is a virtual ground memory array.

15. The method of claim 12, further comprising erasing at least one of the memory cells, including
    applying a seventh bias onto the first bit line of the memory cell,
    applying a eighth bias onto the second bit line of the memory cell, and
    applying a ninth bias onto the word line of the memory cell, wherein the voltage level of the ninth bias is lower than the voltage levels of the seventh and eighth biases.

16. The method of claim 12, wherein the memory device comprises a substrate, wherein the bit lines are buried diffused areas formed in the substrate, and the word lines comprise contact stripes formed over the substrate, and wherein memory cells in a column share at least one bit line, and memory cells in a row share at least one word line.

17. The method of claim 12, wherein memory cells in consecutive columns are programmed in alternating sides of the trapping layer.

18. The method of claim 17, further comprising reading at least one memory cell, wherein reading the memory cell comprises sensing a current through the bit line that is on the same side of the memory cell as the programmed side.

19. The method of claim 12, wherein all of the memory cells in the memory array are programmed on the same side of the trapping layer.

20. The method of claim 19, further comprising reading at least one memory cell, wherein reading the memory cell comprises sensing a current through the bit line that is on a side of the memory cell opposite to the programmed side of the memory cell.

* * * * *